(12) United States Patent
Yoshimori

(10) Patent No.: US 11,664,253 B2
(45) Date of Patent: May 30, 2023

(54) SEMICONDUCTOR MANUFACTURING APPARATUS AND METHOD OF MANUFACTURING SEMICONDUCTOR DEVICE

(71) Applicant: Kioxia Corporation, Tokyo (JP)

(72) Inventor: Kazuya Yoshimori, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 869 days.

(21) Appl. No.: 16/541,227

(22) Filed: Aug. 15, 2019

(65) Prior Publication Data
US 2020/0303224 A1    Sep. 24, 2020

(30) Foreign Application Priority Data
Mar. 18, 2019   (JP) .............................. JP2019-050341

(51) Int. Cl.
*H01L 21/683*     (2006.01)
*H01J 37/32*      (2006.01)
*H01L 21/67*      (2006.01)
*H01J 37/22*      (2006.01)

(52) U.S. Cl.
CPC ........ *H01L 21/67259* (2013.01); *H01J 37/22* (2013.01); *H01J 37/32715* (2013.01); *H01L 21/67069* (2013.01); *H01L 21/6831* (2013.01); *H01J 2237/2007* (2013.01); *H01J 2237/24578* (2013.01); *H01J 2237/334* (2013.01)

(58) Field of Classification Search
CPC ......... H01L 21/67259; H01L 21/67069; H01L 21/6831; H01J 37/22; H01J 37/32715; H01J 2237/2007; H01J 2237/24578; H01J 2237/334

USPC ................................. 382/144; 118/715–733; 156/345.1–345.55
See application file for complete search history.

(56) References Cited

U.S. PATENT DOCUMENTS

| | | | |
|---|---|---|---|
| 9,099,513 B2 | 8/2015 | Kogure | |
| 2003/0186563 A1* | 10/2003 | Kobayashi | ............ H01L 21/324 438/795 |
| 2010/0006225 A1* | 1/2010 | Yokogawa | ........ H01J 37/32935 156/345.28 |
| 2010/0025369 A1 | 2/2010 | Negishi et al. | |

(Continued)

FOREIGN PATENT DOCUMENTS

| | | |
|---|---|---|
| JP | 4057165 B2 | 3/2008 |
| JP | 2009-182094 A | 8/2009 |

(Continued)

*Primary Examiner* — Charlee J. C. Bennett
(74) *Attorney, Agent, or Firm* — Oblon, McClelland, Maier & Neustadt, L.L.P.

(57) ABSTRACT

In one embodiment, a semiconductor manufacturing apparatus includes a housing configured to house a substrate, and a plasma supplier configured to supply plasma on an upper face of the substrate. The apparatus further includes a support configured to support the substrate and a ring surrounding an end portion of the substrate, the ring including a member having a lower face on which a mark to be photographed is provided. The apparatus further includes equipment configured to photograph the mark or receive an image of the mark through a wiring that includes a first end portion able to be disposed in a vicinity of the mark and a second end portion different from the first end portion.

6 Claims, 5 Drawing Sheets

(56) References Cited

U.S. PATENT DOCUMENTS

| | | | |
|---|---|---|---|
| 2010/0326957 A1* | 12/2010 | Maeda | H01J 37/20 156/345.26 |
| 2011/0043228 A1* | 2/2011 | Makhratchev | H01J 37/32642 324/691 |
| 2017/0243777 A1 | 8/2017 | Ohashi et al. | |
| 2018/0019107 A1 | 1/2018 | Ishizawa | |
| 2018/0061696 A1* | 3/2018 | D'Ambra | H01L 21/68735 |
| 2018/0261481 A1* | 9/2018 | Eto | H01L 21/67288 |
| 2018/0315640 A1* | 11/2018 | Ueda | H01L 21/68742 |
| 2019/0108986 A1* | 4/2019 | Saitoh | H01L 21/67259 |
| 2020/0013657 A1* | 1/2020 | Lee | H01L 21/67288 |
| 2020/0273678 A1* | 8/2020 | Funk | H01J 37/32642 |
| 2021/0378100 A1* | 12/2021 | Criminale | H01L 21/67253 |
| 2021/0378119 A1* | 12/2021 | Criminale | H05K 7/1427 |

FOREIGN PATENT DOCUMENTS

| | | |
|---|---|---|
| JP | 2010-34416 A | 2/2010 |
| JP | 5001432 B2 | 8/2012 |
| JP | 2017-152437 A | 8/2017 |
| JP | 2018-10992 A | 1/2018 |

* cited by examiner

SEMICONDUCTOR MANUFACTURING APPARATUS AND METHOD OF MANUFACTURING SEMICONDUCTOR DEVICE

CROSS REFERENCE TO RELATED APPLICATION

This application is based upon and claims the benefit of priority from the prior Japanese Patent Application No. 2019-050341, filed on Mar. 18, 2019, the entire contents of which are incorporated herein by reference.

FIELD

Embodiments described herein relate to a semiconductor manufacturing apparatus and a method of manufacturing a semiconductor device.

BACKGROUND

In performing plasma treatment to an end portion of a wafer surrounded by a dummy ring, it is desirable to employ a method that can appropriately measure a positional deviation of the dummy ring.

DETAILED DESCRIPTION

Figure 1:
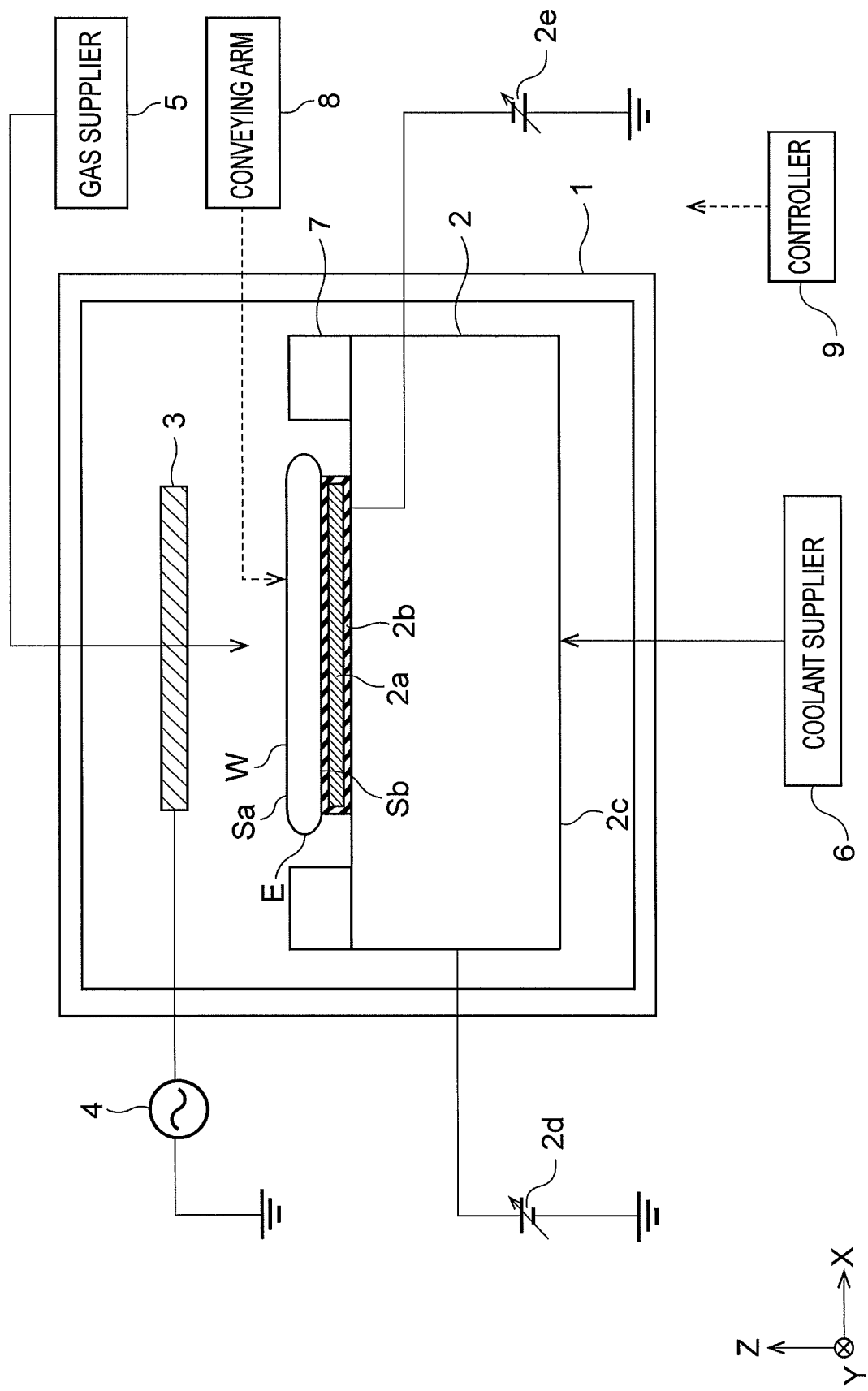
FIG. 1 is a sectional view schematically showing a structure of a semiconductor manufacturing apparatus of a first embodiment.

In one embodiment, a semiconductor manufacturing apparatus includes a housing configured to house a substrate, and a plasma supplier configured to supply plasma on an upper face of the substrate. The apparatus further includes a support configured to support the substrate and a ring surrounding an end portion of the substrate, the ring including a member having a lower face on which a mark to be photographed is provided. The apparatus further includes equipment configured to photograph the mark or receive an image of the mark through a wiring that includes a first end portion able to be disposed in a vicinity of the mark and a second end portion different from the first end portion.

Embodiments will now be explained with reference to the accompanying drawings. In FIGS. 1 to 8, the same or similar constituent is denoted by the same reference numeral, and a repeated description will be omitted.

First Embodiment

FIG. 1 is a sectional view schematically showing a structure of a semiconductor manufacturing apparatus of a first embodiment. The semiconductor manufacturing apparatus of FIG. 1 is, for example, a plasma treatment apparatus such as a plasma etching apparatus.

The semiconductor manufacturing apparatus of FIG. 1 includes a treatment chamber 1, an electrostatic chuck (ESC) 2, an upper electrode 3, an alternate current (AC) power supply 4, a gas supplier 5, a coolant supplier 6, a dummy ring 7, a conveying arm 8, and a controller 9. The treatment chamber 1 is an example of a housing. The ESC 2 is an example of a support. The upper electrode 3, the AC power supply 4, and the gas supplier 5 are examples of a plasma supplier. The dummy ring 7 is an example of a ring.

The ESC 2 includes a high voltage (HV) electrode (lower electrode) 2a, an insulator 2b, an ESC base 2c, an AC power supply 2d, and an ESC power supply 2e. The lower electrode 2a constitutes a plasma supplier together with the upper electrode 3, the AC power supply 4, and the gas supplier 5.

The treatment chamber 1 houses a wafer (substrate) W to be treated. FIG. 1 shows an upper face Sa, a lower face (back face) Sb, and an end portion (bevel) E of a wafer W. FIG. 1 further shows an X direction and a Y direction parallel to the upper face Sa and the lower face Sb of the wafer W and perpendicular to each other, and a Z direction perpendicular to the upper face Sa and the lower face Sb of the wafer W. In the present specification, a +Z direction is treated as the upward direction, and a −Z direction is treated as the downward direction. The −Z direction may be consistent with the gravity direction or may not be consistent with the gravity direction.

The ESC 2 supports the wafer W and the dummy ring 7 in the treatment chamber 1. The upper electrode 3 is provided outside the ESC 2, whereas the HV electrode 2a is provided in the ESC 2. The HV electrode 2a is covered with an insulator 2b and provided on the ESC base 2c. The AC power supply 2d is a variable voltage source for adjusting the potential of the HV electrode 2a. The ESC power supply 2e is a variable voltage source for adjusting the potential of the ESC base 2c. The wafer W is placed on the HV electrode 2a via the insulator 2b. The ESC 2 electrostatically adsorbs the wafer W by the HV electrode 2a. The ESC 2 can raise and lower the wafer W with a plurality of pins provided on the upper face of the ESC 2.

The upper electrode 3 is provided above the HV electrode 2a. The semiconductor manufacturing apparatus of FIG. 1 generates plasma between the upper electrode 3 and the HV electrode 2a, supplies the plasma to the upper face Sa of the wafer W, and treats the wafer W with the plasma. Specifically, the upper face Sa of the wafer W is etched by dry etching using the plasma.

The AC power supply 4 supplies an AC current to the upper electrode 3. Thereby, the plasma is generated between the upper electrode 3 and the HV electrode 2a.

The gas supplier 5 supplies a process gas for plasma generation into the treatment chamber 1. The upper electrode 3 and the HV electrode 2a generate plasma from the process gas by using the AC current from the AC power supply 4. The process gas is, for example, a silicon tetrafluoride ($SiF_4$) gas.

The coolant supplier 6 supplies a coolant to the wafer W through a coolant flow path provided in the ESC 2. The coolant is, for example, an inert gas such as a rare gas and the specific example thereof is a helium (He) gas.

The dummy ring 7 has a ring shape, and is placed on the ESC base 2c so as to surround the end portion E of the wafer W. The dummy ring 7 is placed in order, for example, to prevent an excess plasma from reaching the end portion E of the wafer W and excessively etching the end portion E of the wafer W. A detail of the dummy ring 7 will be described later.

Before the plasma treatment is started, the conveying arm 8 carries the wafer W into the treatment chamber 1 and places the wafer W on the HV electrode 2a. After the plasma treatment has ended, the conveying arm 8 takes the wafer W out of the treatment chamber 1.

The controller 9 controls various operations of the semiconductor manufacturing apparatus of FIG. 1. The controller 9 controls, for example, the operation of the treatment chamber 1, the operation of the ESC 2, the on/off and current value of the AC power supply 4, the on/off and process gas supply amount of the gas supplier 5, the on/off and coolant supply amount of the coolant supplier 6, and the operation of the conveying arm 8. Further, the controller 9 can adjust the placement position of the wafer W with the conveying arm 8 as described later. Examples of the controller 9 are a processor, an electrical circuit, a personal computer (PC), and the like.

The semiconductor manufacturing apparatus of FIG. 1 may be provided with a ring conveying arm for conveying the dummy ring 7 as the conveying arm 8 in addition to the wafer conveying arm for conveying the wafer W. In this case, the ring conveying arm can carry the dummy ring 7 into the treatment chamber 1 to place the dummy ring 7 on the ESC base 2c and take the dummy ring 7 out of the treatment chamber 1. The operation of the ring carrying arm is controlled by the controller 9.

Figure 2:
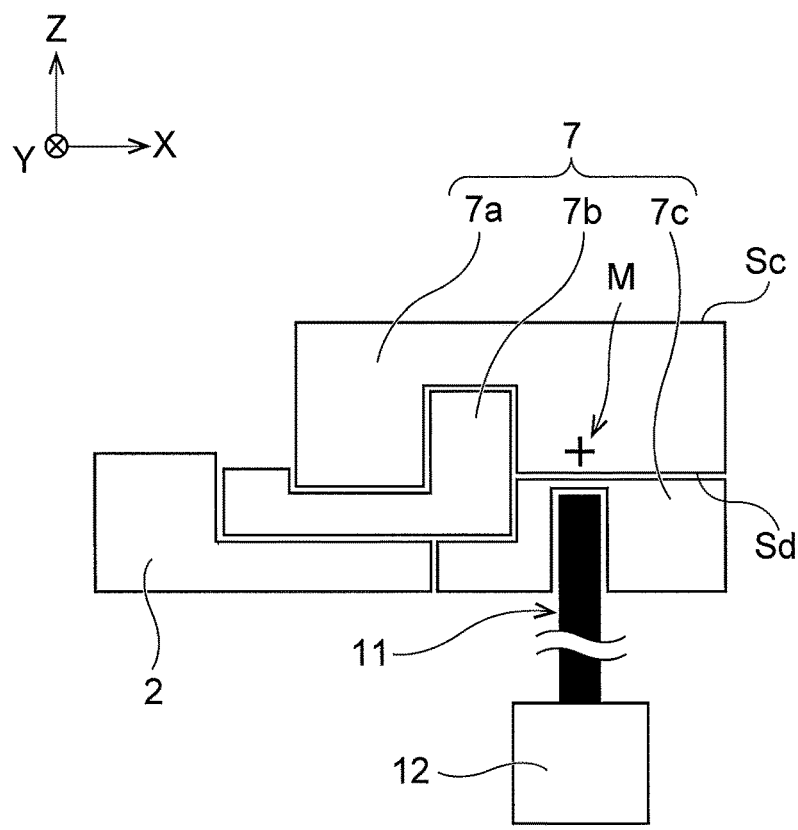
FIG. 2 is a sectional view showing a detailed structure of the semiconductor manufacturing apparatus of the first embodiment.

FIG. 2 is a sectional view showing a detailed structure of the semiconductor manufacturing apparatus of the first embodiment.

The semiconductor manufacturing apparatus of the present embodiment includes, in addition to the components shown in FIG. 1, a cable 11 which is an example of a wiring and a camera 12 which is an example of equipment for photographing. Further, the dummy ring 7 includes a top ring 7a, a middle ring 7b, and a bottom ring 7c. The top ring 7a is an example of a first member, and the bottom ring 7c is an example of a second member.

The top ring 7a, the middle ring 7b, and the bottom ring 7c all have a ring shape surrounding the end portion E of the wafer W and are configured to be detachable from each other. The top ring 7a is disposed on the middle ring 7b and the bottom ring 7c. The middle ring 7b is disposed on the bottom ring 7c. The dummy ring 7 may include only the top ring 7a and the bottom ring 7c and may not include the middle ring 7b. FIG. 2 shows the dummy ring 7 placed on the ESC 2.

FIG. 2 further shows an upper face Sc and a lower face (back face) Sd of the top ring 7a. The upper face Sc of the top ring 7a is located on the side of the upper electrode 3, and hence the upper face Sc is exposed directly to the plasma. On the other hand, the lower face Sd of the top ring 7a is located on the side opposite to the upper electrode 3, and hence the lower face Sd is not exposed directly to the plasma. The top ring 7a of the present embodiment includes at least one alignment mark M on the lower face Sd. An alignment mark M is a mark for measurement of the positional deviation of the dummy ring 7 (more specifically, the positional deviation of the top ring 7a) and becomes a target to be photographed by the camera 12. A disposable member may be used for the top ring 7a because the top ring 7a may deteriorate by being exposed to the plasma.

The alignment mark M may be realized in any manner so long as the camera 12 can photograph the alignment mark M. For example, almost the entire top ring 7a may be formed of a first material, and the alignment mark M may be formed of a second material different from the first material. The alignment mark M may be a hole or a groove provided on the lower face Sd of the top ring 7a.

The bottom ring 7c is disposed so as to cover the alignment mark M under the lower face Sd of the top ring 7a. The bottom ring 7c has a vertical hole for photographing the alignment mark M. The vertical hole extends from the lower face of the bottom ring 7c to the vicinity of the alignment mark M. The vertical hole does not penetrate the bottom ring 7c in the present embodiment, but may penetrate the bottom ring 7c. When the vertical hole does not penetrate the bottom ring 7c, it is possible to prevent the plasma, having entered between the top ring 7a and the bottom ring 7c, from entering the vertical hole.

The cable 11 has a first end portion inserted into the vertical hole and disposed in the vicinity of the alignment mark M, and a second end portion different from the first end portion. In FIG. 2, the first end portion is the upper end portion of the cable 11 and the second end portion is the lower end portion of the cable 11. The second end portion is located in the vicinity of the camera 12 outside the dummy ring 7 and connected to the camera 12. The cable 11 of the present embodiment is, for example, a fiberscope cable.

The camera 12 is disposed outside the dummy ring 7 and remotely photographs the alignment mark M through the cable 11. In the present embodiment, a portion between the alignment mark M and the first end portion in the bottom ring 7c is formed of a transparent material (e.g., quartz) so that the camera 12 can photograph the alignment mark M through the cable 11. The first end portion faces the alignment mark M through the transparent portion. Only a part of the bottom ring 7c may be formed of the transparent material, or the entire bottom ring 7c may be formed of the transparent material. The camera 12 acquires an image of the alignment mark M by photographing the alignment mark M from the outside of the dummy ring 7 and outputs the image to the controller 9. The semiconductor manufacturing apparatus of the present embodiment may be provided with a light source that irradiates the inside of the vertical hole with light to facilitate photographing of the alignment mark M.

The top ring 7a of the present embodiment includes the alignment mark M on the lower face Sd not exposed directly to the plasma rather than on the upper face Sc exposed directly to the plasma. Therefore, the camera 12 can photograph the alignment mark M at all times. For example, the alignment mark M may be photographed while the plasma is being supplied to the wafer W on the ESC 2, or the alignment mark M may be photographed in a state where the plasma remains in the treatment chamber 1. In these cases, since the cable 11 and the camera 12 of the present embodiment can be installed in a place not exposed directly to the plasma, it is possible to prevent the cable 11 and the camera 12 from being stained with the plasma.

The controller 9 identifies the position of the alignment mark M based on the image received from the camera 12. Hence it is possible to identify the deviation between the initial position and the current position of the alignment mark M.

The controller 9 further adjusts the position of the wafer W on the ESC 2 by using the conveying arm 8 based on the result of identifying the position of the alignment mark M. Specifically, the controller 9 changes the position of the wafer W by the same amount as the deviation between the initial position and the current position of the alignment mark M. It is thereby possible to reduce the positional deviation of the dummy ring 7 with respect to the wafer W (more specifically, the top ring 7a).

In the present embodiment, for example, when a plurality of wafers W are treated in order in a semiconductor manufacturing apparatus, the alignment mark M is photographed between the treatment of a certain wafer (first wafer) W and the treatment of the next wafer (second wafer) W, to identify the position of the alignment mark M. In the case of there being a deviation between the initial position and the current position of the alignment mark M, at the time when the second wafer W is carried into the treatment chamber 1 and placed on the ESC 2, the placement position of the second wafer W is changed from the original position by the same amount as the deviation. Thereafter, the plasma treatment of the second wafer W is started.

As thus described, in the present embodiment, the positional deviation of the top ring 7a is measured, but instead the positional deviation of the middle ring 7b or the bottom ring 7c may be measured. The reason for measuring the positional deviation of the top ring 7a in the present embodiment is because the deviation between the position of the wafer W and the position of the top ring 7a greatly affects the plasma treatment. However, for example, when emphasis is placed on a reason different from the above, the positional deviation of the member excluding the top ring 7a and constituting the dummy ring 7 may be measured.

The positions of the camera 12 and the cable 11 of the present embodiment are fixed with respect to the ESC 2. Therefore, the initial position and the current position of the alignment mark M of the present embodiment are positions with respect to the ESC 2. In the present embodiment, there is a gap between the ESC 2 and the dummy ring 7, and there is also a gap between the top ring 7a, the middle ring 7b, and the bottom ring 7c, so that the position of the top ring 7a may deviate with respect to the ESC 2.

Figures 3A, 3B:
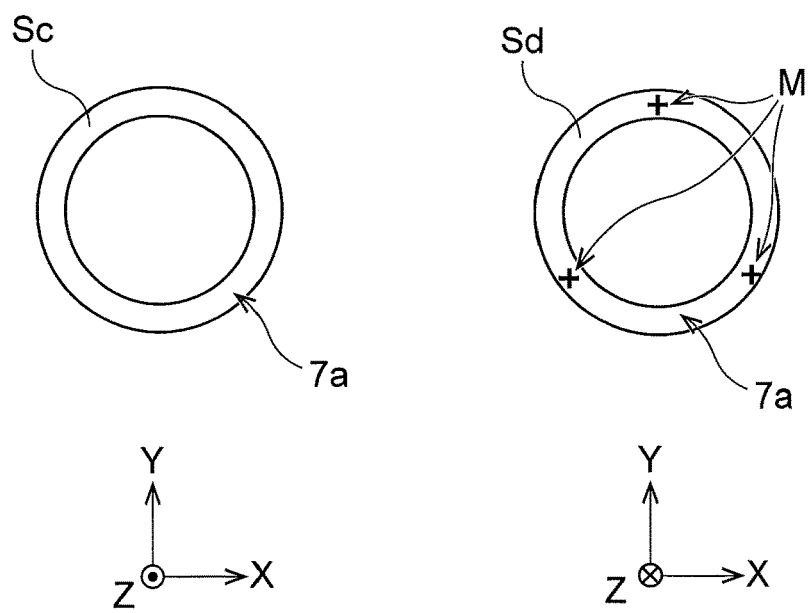
FIGS. 3A and 3B are plan views showing a structure of a top ring of the first embodiment.

FIGS. 3A and 3B are plan views each showing the structure of the top ring 7a of the first embodiment.

FIG. 3A shows the upper face Sc of the top ring 7a, and FIG. 3B shows the lower face Sd of the top ring 7a. The top ring 7a shown in FIG. 3B has three alignment marks M arranged at intervals of 120 degrees. Each alignment mark M of the present embodiment has a shape in which a portion extending in the X direction and a portion extending in the Y direction intersect with each other as shown in FIG. 3B, but each alignment mark M may have another shape.

When the top ring 7a is provided with N (N is an integer equal to or greater than 2) alignment marks M, the semiconductor manufacturing apparatus of the present embodiment may include N sets of cables 11 and cameras 12. In this case, each alignment mark M is remotely photographed by the corresponding cable 11 and camera 12. On the other hand, the semiconductor manufacturing apparatus of the present embodiment may include N cables 11 and one camera 12 for the N alignment marks M. In this case, these alignment marks M are all photographed by the same camera 12.

Figure 4A:
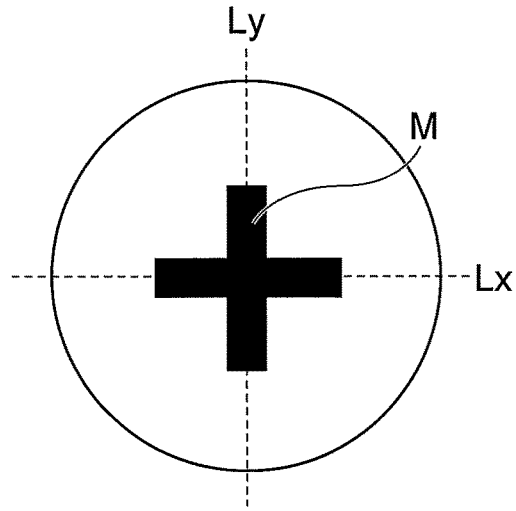
FIGS. 4A and 4B are views for explaining an alignment mark of the first embodiment.
Figure 4B:
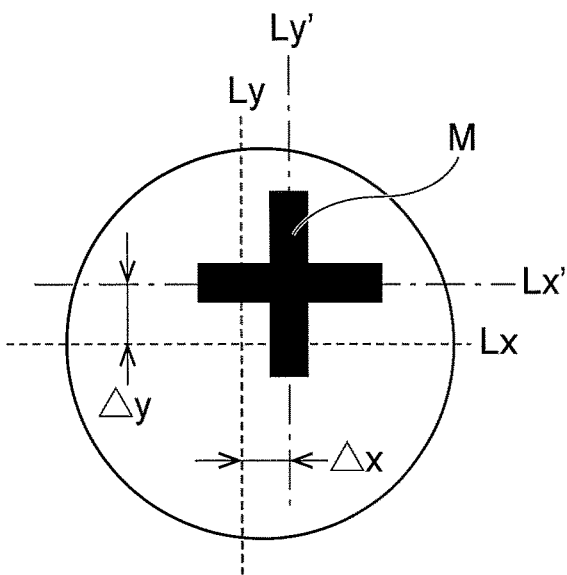

FIGS. 4A and 4B are views for explaining the alignment mark M of the first embodiment.

FIG. 4A shows a taken image of the alignment mark M. An intersection of straight lines Lx, Ly shows the initial position of the alignment mark M. The alignment mark M of FIG. 4A is located at the initial position.

FIG. 4B shows a taken image of the alignment mark M. Straight lines Lx', Ly' show a central axis of a portion constituting the alignment mark M and extending in the X direction and a central axis of a portion constituting the alignment mark M and extending in the Y direction, respectively. The alignment mark M of FIG. 4B has deviated from the initial position. In FIG. 4B, $\Delta x$ represents an amount of deviation in the X direction, and $\Delta y$ represents an amount of deviation in the Y direction.

In the present embodiment, for example, the placement position of the wafer W at a first point is determined based on the deviation amounts $\Delta x$, $\Delta y$ of the first alignment mark M, the placement position of the wafer W at a second point is determined based on the deviation amounts $\Delta x$, $\Delta y$ of the second alignment mark M, and the placement position of the wafer W at a third point is determined based on the deviation amounts $\Delta x$, $\Delta y$ of the third alignment mark M. In the present embodiment, by placing the wafer W based on these determined placement positions, it is possible to reduce the positional deviation of the dummy ring 7 with respect to the wafer W.

The positional deviation of the dummy ring 7 may be analyzed by a method different from the method of FIGS. 4A and 4B. In the analysis of the positional deviation of the dummy ring 7, an angle of rotation of the alignment mark M in an XY plane may be measured.

Figure 5:
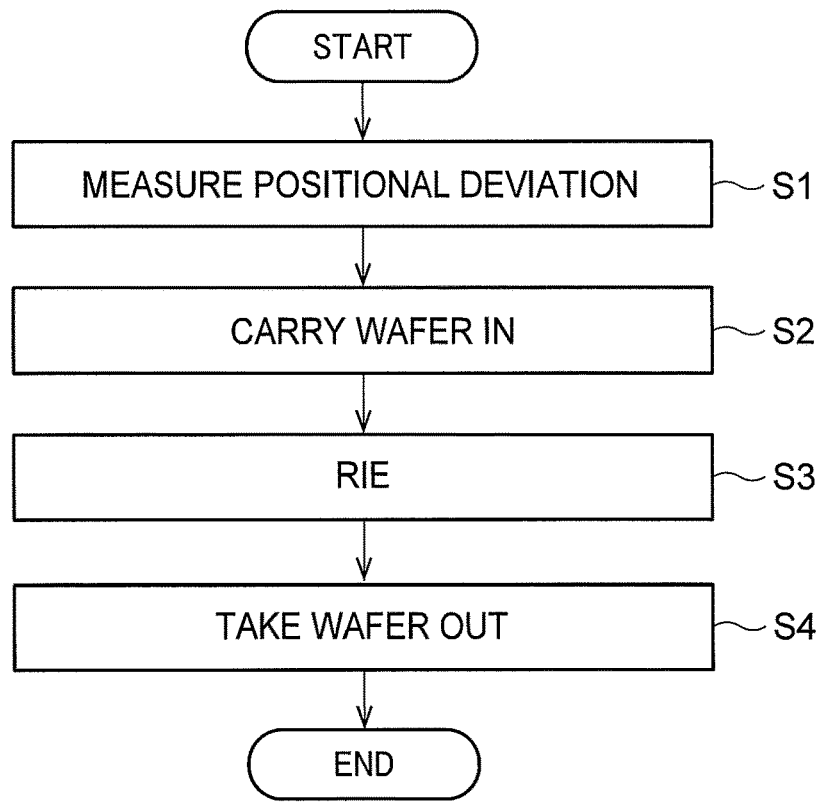
FIG. 5 is a flowchart showing an operation example of the semiconductor manufacturing apparatus of the first embodiment.

FIG. 5 is a flowchart showing an operation example of the semiconductor manufacturing apparatus of the first embodiment. FIG. 5 shows the flow of the plasma treatment of one wafer W.

First, before the wafer W is carried into the treatment chamber 1, the positional deviation of the dummy ring 7 is measured (step S1). Then, based on the measurement result of the positional deviation of the dummy ring 7, the wafer W is carried into the treatment chamber 1 and placed on the ESC 2 (step S2). Specifically, the placement position of the wafer W is changed by the same amount as the positional deviation of the dummy ring 7.

Next, the plasma treatment of the wafer W is performed and, for example, dry etching such as reactive ion etching (RIE) is performed (step S3). The wafer W includes, for example, a semiconductor substrate and a film on the semiconductor substrate, and the film is etched by RIE. Then, the wafer W is taken out of the treatment chamber 1 (step S4).

The semiconductor manufacturing apparatus of the present embodiment repeats steps S1 to S4 to perform the plasma treatment on a plurality of wafers W in order. Step S1 may be performed for each two or more wafers W instead of being performed for each one wafer W.

As described above, the dummy ring 7 of the present embodiment includes at least one alignment mark M on the lower face Sd of the top ring 7a. The semiconductor manufacturing apparatus of the present embodiment includes the cable 11 having the end portion disposed in the vicinity of the alignment mark M and the camera 12 for photographing the alignment mark M through the cable 11. Therefore, according to the present embodiment, it is possible to appropriately measure the position of the dummy ring 7, such as to measure the position of the dummy ring 7 while suppressing the influence of the plasma.

Second Embodiment

Figure 6:
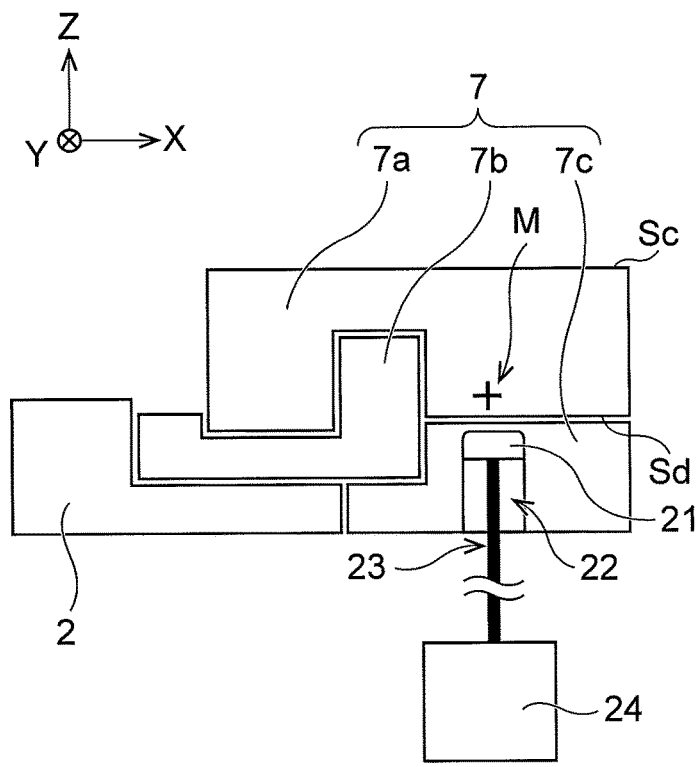
FIG. 6 is a sectional view showing a structure of a semiconductor manufacturing apparatus of a second embodiment.

FIG. 6 is a sectional view showing a structure of a semiconductor manufacturing apparatus of a second embodiment.

The semiconductor manufacturing apparatus of FIG. 6 includes, instead of the cable 11 and the camera 12, a charge coupled device (CCD) element 21 which is an example of an imaging element, a fixture (jig) 22, a cable 23 which is an example of a wiring, and a receiver 24 which is an example of equipment for reception.

The structure of the dummy ring 7 is the same as in the first embodiment. Hence the bottom ring 7c has a vertical hole for photographing the alignment mark M. The vertical hole does not penetrate the bottom ring 7c in the present embodiment, but may penetrate the bottom ring 7c.

The cable 23 has a first end portion inserted into the vertical hole and disposed in the vicinity of the alignment mark M, and a second end portion different from the first end portion. In FIG. 6, the first end portion is the upper end portion of the cable 23 and the second end portion is the lower end portion of the cable 23. The second end portion is located in the vicinity of the receiver 24 outside the dummy ring 7 and connected to the receiver 24. The first end portion is located in the vicinity of the CCD element 21 inside the dummy ring 7 and connected to the CCD element 21. The cable 23 of the present embodiment is, for example, a connection cable between the CCD element 21 and the receiver 24.

The CCD element 21 is disposed inside the dummy ring 7, specifically at a position between the alignment mark M and the first end portion, and photographs the alignment mark M from this position. In the present embodiment, a portion between the alignment mark M and the CCD element 21 in the bottom ring 7c is formed of a transparent material (e.g., quartz) so that the CCD element 21 can photograph the alignment mark M. The CCD element 21 faces the alignment mark M through the transparent portion. The CCD element 21 acquires an image of the alignment mark M by photographing the alignment mark M from the inside of the dummy ring 7 and outputs the image to the receiver 24 through the cable 23. The semiconductor manufacturing apparatus of the present embodiment may be provided with a light source that irradiates the inside of the vertical hole with light to facilitate photographing of the alignment mark M.

The fixture 22 is disposed in the vertical hole in order to fix the CCD element 21 to the tip of the vertical hole. The CCD element 21 is sandwiched between the bottom ring 7c and the fixture 22. The cable 23 penetrates the fixture 22.

The receiver 24 is disposed outside the dummy ring 7 and receives the image taken by the CCD element 21 through the cable 23. The receiver 24 of the present embodiment also has a function of a controller for controlling the CCD element 21. Therefore, the CCD element 21 of the present embodiment photographs the alignment mark M in response to a signal from the receiver 24 and outputs the image data obtained by the photographing to the receiver 24. The receiver 24 outputs the image taken by the CCD element 21 to the controller 9.

The controller 9 identifies the position of the alignment mark M based on the image received from the receiver 24. Hence it is possible to identify the deviation between the initial position and the current position of the alignment mark M. The subsequent processing by the controller 9 is the same as in the first embodiment.

The position of the CCD element 21 of the present embodiment is fixed with respect to the bottom ring 7c. Further, the bottom ring 7c of the present embodiment is heavier than the top ring 7a, so that the position of the bottom ring 7c hardly deviates like the position of the top ring 7a. Therefore, the initial position and the current position of the alignment mark M of the present embodiment are positions roughly with respect to the ESC 2 as in the first embodiment.

As described above, the dummy ring 7 of the present embodiment includes at least one alignment mark M on the lower face Sd of the top ring 7a. The semiconductor manufacturing apparatus of the present embodiment includes the cable 23 having the end portion disposed in the vicinity of the alignment mark M and the receiver 24 for receiving an image of the alignment mark M from the CCD element 21 through the cable 23. Therefore, according to the present embodiment, as in the first embodiment, it is possible to appropriately measure the position of the dummy ring 7, such as to measure the position of the dummy ring 7 while suppressing the influence of the plasma.

When the top ring 7a is provided with N (N is an integer equal to or greater than 2) alignment marks M, the semiconductor manufacturing apparatus of the present embodiment may include N sets of CCD elements 21, fixtures 22, cables 23, and receivers 24. In this case, an image of each alignment mark M is taken by the corresponding CCD element 21 and the image is output to the corresponding receiver 24. On the other hand, the semiconductor manufacturing apparatus of the present embodiment may include N sets of CCD elements 21, fixtures 22, cables 23, and one receiver 24 for N alignment marks M. In this case, the images of these alignment marks M are all received by the same receiver 24.

Third Embodiment

Figure 7:
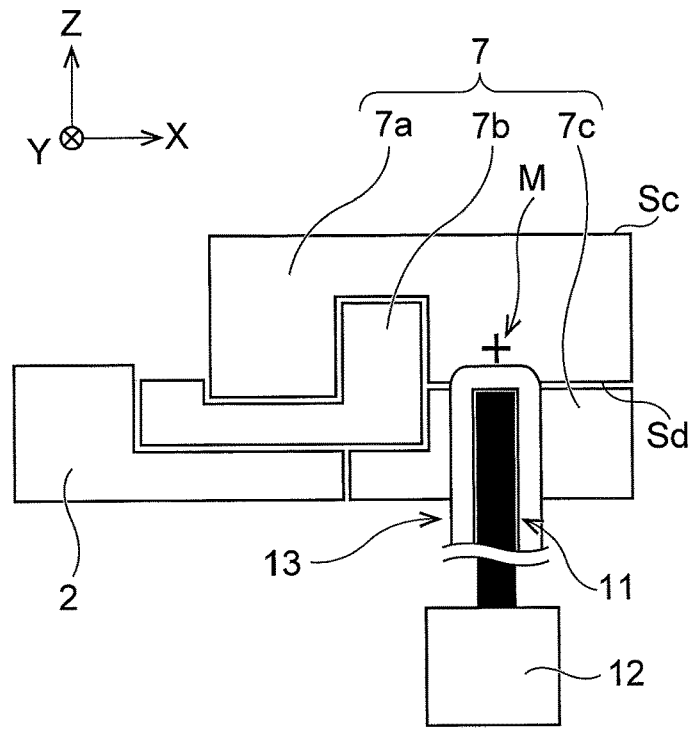
FIG. 7 is a sectional view showing a structure of a semiconductor manufacturing apparatus of a third embodiment.

FIG. 7 is a sectional view showing a structure of a semiconductor manufacturing apparatus of a third embodiment.

The semiconductor manufacturing apparatus of the present embodiment includes, in addition to the components shown in FIG. 1, the cable 11 and the camera 12 described above and a plurality of pins 13.

The structure of the dummy ring 7 is roughly the same as in the first embodiment. However, the bottom ring 7c of the present embodiment has a plurality of vertical holes penetrating the bottom ring 7c, and the plurality of pins 13 described above are inserted in these vertical holes. The pin 13 has a function of raising and lowering the top ring 7a and is used to adjust the height of the top ring 7a. The operation of the pin 13 is controlled by the controller 9.

FIG. 7 shows a cable 11 inserted into any of the vertical holes. The cable 11 has a first end portion inserted into the vertical hole through the pin 13 and disposed in the vicinity of the alignment mark M, and a second end portion different from the first end portion. In FIG. 7, the first end portion is the upper end portion of the cable 11 and the second end portion is the lower end portion of the cable 11. The second end portion is located in the vicinity of the camera 12 outside the dummy ring 7 and connected to the camera 12. The first end portion is located in the vicinity of the alignment mark M inside the pin 13 and fixed to the pin 13. The pin 13 is interposed between the alignment mark M and the first end portion.

The camera 12 is disposed outside the dummy ring 7 and remotely photographs the alignment mark M through the cable 11. In the present embodiment, a portion between the alignment mark M and the first end portion in the pin 13 of FIG. 7 is formed of a transparent material (e.g., quartz) so that the camera 12 can photograph the alignment mark M through the cable 11. The first end portion faces the alignment mark M through the transparent portion. Only a part of the pin 13 may be formed of the transparent material, or the entire pin 13 may be formed of the transparent material. The camera 12 acquires an image of the alignment mark M by photographing the alignment mark M from the outside of the dummy ring 7 and outputs the image to the controller 9. The subsequent operation of the controller 9 is the same as in the first embodiment. The semiconductor manufacturing apparatus of the present embodiment may be provided with a light source that irradiates the inside of the vertical hole with light to facilitate photographing of the alignment mark M.

As described above, according to the present embodiment, it is possible to photograph the alignment mark M by using the vertical hole for the pin 13.

In the present embodiment, for example, the bottom ring 7c has six vertical holes, six pins 13 are provided in these vertical holes, and the top ring 7a is provided with three alignment marks M. In this case, three sets out of the six sets of vertical holes and pins 13 are used to insert three cables 11.

The position of the camera 12 of the present embodiment and the positions of the first end portion of the cable 11 and the pins 13 of the present embodiment within the XY plane are fixed with respect to the ESC 2. Therefore, the initial position and the current position of the alignment mark M of the present embodiment are positions with respect to the ESC 2.

Fourth Embodiment

Figure 8:
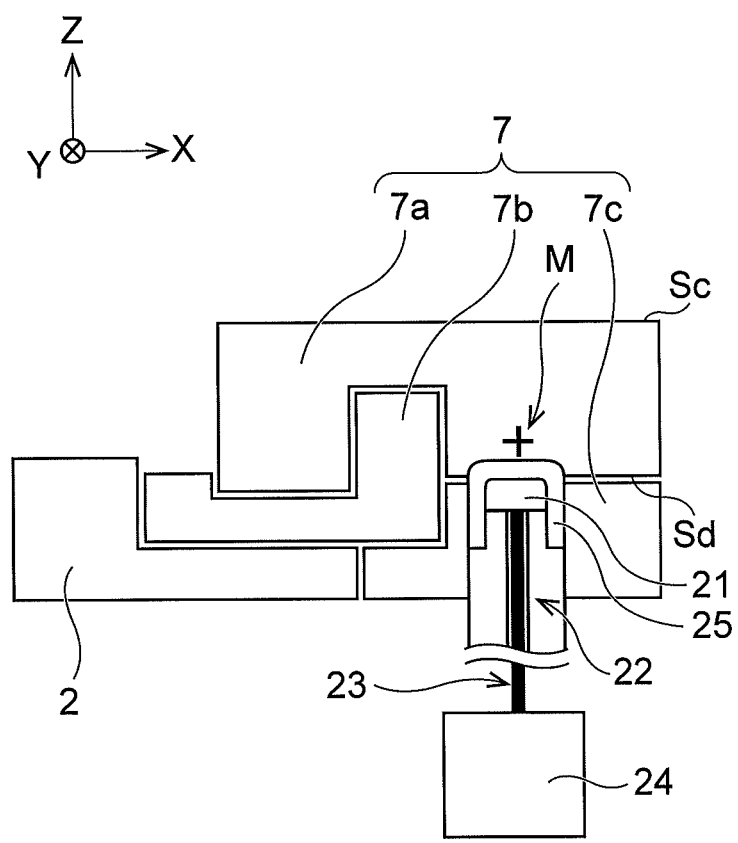
FIG. 8 is a sectional view showing a structure of a semiconductor manufacturing apparatus of a fourth embodiment.

FIG. 8 is a sectional view showing a structure of a semiconductor manufacturing apparatus of a fourth embodiment.

The semiconductor manufacturing apparatus of the present embodiment includes, in addition to the components shown in FIG. 1, the CCD element 21, the fixture 22, the cable 23, and the receiver 24 described above, and a plurality of pins 25.

The structure of the dummy ring 7 is roughly the same as in the first embodiment. However, the bottom ring 7c of the present embodiment has a plurality of vertical holes penetrating the bottom ring 7c, and the plurality of pins 25 described above are inserted in these vertical holes. The pin 25 has a function of raising and lowering the top ring 7a and is used to adjust the height of the top ring 7a. The operation of the pin 25 is controlled by the controller 9.

FIG. 8 shows a cable 23 inserted into any of the vertical holes. The cable 23 has a first end portion inserted into the vertical hole through the pin 25 and disposed in the vicinity of the alignment mark M, and a second end portion different from the first end portion. In FIG. 8, the first end portion is the upper end portion of the cable 23 and the second end portion is the lower end portion of the cable 23. The second end portion is located in the vicinity of the receiver 24 outside the dummy ring 7 and connected to the receiver 24. The first end portion is located in the vicinity of the CCD element 21 inside the pin 25 and connected to the CCD element 21. The pin 25 and the CCD element 21 are interposed between the alignment mark M and the first end portion.

The CCD element 21 is disposed inside the pin 25, specifically at a position between the alignment mark M and the first end portion, and photographs the alignment mark M from this position through the pin 25. In the present embodiment, a portion between the alignment mark M and the CCD element 21 in the pin 25 of FIG. 8 is formed of a transparent material (e.g., quartz) so that the CCD element 21 can photograph the alignment mark M. The CCD element 21 faces the alignment mark M through the transparent portion. Only a part of the pin 25 may be formed of the transparent material, or the entire pin 25 may be formed of the transparent material. The CCD element 21 acquires an image of the alignment mark M by photographing the alignment mark M from the inside of the dummy ring 7 and outputs the image to the receiver 24 through the cable 23. The semiconductor manufacturing apparatus of the present embodiment may be provided with a light source that irradiates the inside of the vertical hole with light to facilitate photographing of the alignment mark M.

The fixture 22 is fixed to the pin 25 in order to fix the CCD element 21 to the tip of the pin 25. The CCD element 21 is sandwiched between the bottom pin 25 and the fixture 22. The cable 23 penetrates the fixture 22, and the first end portion of the cable 23 is fixed to the pin 25 together with the CCD element 21.

The receiver 24 is disposed outside the dummy ring 7 and receives the image taken by the CCD element 21 through the cable 23. The receiver 24 of the present embodiment also has a function of a controller for controlling the CCD element 21. Therefore, the CCD element 21 of the present embodiment photographs the alignment mark M in response to a signal from the receiver 24 and outputs the image data obtained by the photographing to the receiver 24. The receiver 24 outputs the image taken by the CCD element 21 to the controller 9. The subsequent operation of the controller 9 is the same as in the second embodiment.

As described above, according to the present embodiment, it is possible to photograph the alignment mark M by using the vertical hole for the pin 25.

In the present embodiment, for example, the bottom ring 7c has six vertical holes, six pins 25 are provided in these vertical holes, and the top ring 7a is provided with three alignment marks M. In this case, three sets out of the six sets of vertical holes and pins 25 are used to insert three cables 23.

The positions of the CCD element 21 and the pin 25 of the present embodiment within the XY plane are fixed with respect to the ESC 2. Therefore, the initial position and the current position of the alignment mark M of the present embodiment are positions with respect to the ESC 2.

While certain embodiments have been described, these embodiments have been presented by way of example only, and are not intended to limit the scope of the inventions. Indeed, the novel apparatuses and methods described herein may be embodied in a variety of other forms; furthermore, various omissions, substitutions and changes in the form of the apparatuses and methods described herein may be made without departing from the spirit of the inventions. The accompanying claims and their equivalents are intended to cover such forms or modifications as would fall within the scope and spirit of the inventions.

The invention claimed is:

1. A semiconductor manufacturing apparatus comprising:
a housing configured to house a substrate;
a plasma supplier configured to supply plasma on an upper face of the substrate;
a support configured to support the substrate and a ring surrounding an end portion of the substrate, the ring including a first member having a lower face on which a mark to be photographed is provided, and a second member disposed under the lower face of the first member;
equipment configured to photograph the mark or receive an image of the mark through a wiring that includes a first end portion able to be disposed in a vicinity of the mark and inserted into the second member so as to face the mark through a transparent portion of the second member, and a second end portion different from the first end portion; and a controller configured to identify a position of the mark based on the image of the mark, and adjust a position of the substrate on the support based on the position of the mark.

2. The apparatus of claim 1, wherein each of the first member and the second member has a ring shape.

3. The apparatus of claim 1, wherein the equipment is a camera configured to photograph the mark through the wiring from an outside of the ring.

4. The apparatus of claim 1, wherein the equipment is a receiver configured to receive the image of the mark at an outside of the ring through the wiring.

5. The apparatus of claim 1, further comprising an imaging element configured to take the image of the mark from a position between the mark and the first end portion, wherein the equipment receives the image taken by the imaging element through the wiring.

6. The apparatus of claim 1, further comprising a pin configured to raise and lower the ring, wherein the first end portion of the wiring is fixed to the pin.

* * * * *